United States Patent [19]

Kundu

[11] Patent Number: 5,793,777
[45] Date of Patent: Aug. 11, 1998

[54] SYSTEM AND METHOD FOR TESTING INTERNAL NODES OF AN INTEGRATED CIRCUIT AT ANY PREDETERMINED MACHINE CYCLE

[75] Inventor: Sandip Kundu, Austin, Tex.

[73] Assignee: International Business Machines Corporation, Armonk, N.Y.

[21] Appl. No.: 635,352

[22] Filed: Apr. 19, 1996

[51] Int. Cl.$^6$ ............................................. G01R 31/28
[52] U.S. Cl. .................................. 371/22.1; 324/158.1
[58] Field of Search ........................... 371/22.1, 22.31, 371/22.36; 364/266; 324/73.1, 158.1

[56] References Cited

U.S. PATENT DOCUMENTS

| | | | |
|---|---|---|---|
| 4,404,519 | 9/1983 | Westcott | 324/73 R |
| 4,622,668 | 11/1986 | Dancker et al. | 371/20 |
| 4,742,293 | 5/1988 | Koo et al. | 324/73 R |
| 4,833,676 | 5/1989 | Koo | 371/25 |
| 4,961,013 | 10/1990 | Obermeyer, Jr. et al. | 307/480 |
| 5,453,993 | 9/1995 | Kitaguchi et al. | 371/22.5 |
| 5,488,613 | 1/1996 | Sridhar | 371/22.3 |

Primary Examiner—Hoa T. Nguyen
Attorney, Agent, or Firm—Mark E. McBurney; Casimer K. Salys

[57] ABSTRACT

A system is provided with scanning capability that can capture data for each internal node at any predetermined machine cycle. The scanning mechanism scans a set of combinational logic and uses the system clock to gate the input to the scanning mechanism. A series of stages are provided in accordance with the number of internal nodes which are not externally connected, and provide input to an internal storage element. Each stage includes a scan latch for storing the data from the previous stages, as well as a latch to store data from the node associated with that particular stage. The cumulative data outputs from the previous stages are multiplexed with the data associated with the present stage and sequentially output, from a third latch, to subsequent stages. In this manner, the scan data is compiled for the internal nodes and output from the final stage in the sequential scanning system of the present invention. A test apparatus is connected to the scan inputs and outputs of the stages to record the scan data for subsequent analysis. The input latches in each stage are gated by the system clock and are capable of storing values for any given machine cycle.

10 Claims, 8 Drawing Sheets

SYSTEM AND METHOD FOR TESTING INTERNAL NODES OF AN INTEGRATED CIRCUIT AT ANY PREDETERMINED MACHINE CYCLE

BACKGROUND OF THE INVENTION

1. Technical Field

The present invention generally relates to the testing of circuits in a digital electronic system. More specifically, the present invention is a system and method for testing components at a very high frequency.

2. Description of Related Art

It is a goal of circuit designers to be able to test each node in the circuit. Of course, those nodes which are connected to output pins are easily testable by reading the value (logical one or a logical zero) on the pin at a given point in time and comparing that output with the expected value. Further, values at nodes which are only connected to output pins through various logic elements can be determined by working backwards from the value on the output pin (through the known logic) to that particular internal node. A problem arises when an internal node is not connected to an output pin (either directly or through known logic elements), but is connected to an internal storage element, such as a latch. This is a common problem, since modern designs may include millions of transistors on a single chip with many being connected to internal storage elements. One solution is to propagate the value on a node to an output by appropriately setting the inputs. However, the inputs may not be directly controllable, or the outputs may not be directly observable because of the presence of these internal storage elements. One solution is to use a scan design which allows the output of the networks to be stored for each machine cycle. Given this information a circuit designer can compare the output at a given cycle with the circuit schematic (and working backward) and determine what the binary value was at a particular node during that cycle.

Typically, in sequential scan testing designs, the output of a set of combinational logic is input to a set of clocked memory elements, e.g. latches, which hold the binary output data from the combinational logic. The latches are basically configured as a series of shift registers which hold the state of the combinational logic at various points in time. These latches are gated based on a scan enable signal. Timing is critical in sequential scan designs, because, the output of the combinational logic may change every cycle. Therefore, if the scan enable signal is much slower than the system clock, then the output of the logic circuits may change one or more times before it is stored in the latches. That is, if the scan enable signal is four times slower than the system clock, the latches may only sample the logic output value at every fourth clock cycle.

Another problem exists in the case of a timing fault where the circuit being evaluated may actually output the correct value, but do so at an unacceptable time. For example, the node being tested may be designed to output a logical "1" one clock cycle after it receives its inputs, but, actually takes three clock cycles to output a logical "1". In this case, if the scan enable is four times slower than the system clock it can be seen that the correct value (logical "1") will be present on the node when the data is sampled. While in reality a timing fault occurred because the node was not at logical "1" during the first cycle after the circuit received its input, which was the actual design point.

One solution is to ensure that the system clock and the scan enable signals are clocked at the same frequency. This would allow the state of each node to be sampled for each machine cycle. However, those skilled in the art will understand that for high frequency clock designs the scan enable circuitry will use a large amount of electrical power, since the wire diameter must be large to minimize transmission time. Thus, it is not practical to make the scan enable clock at the same frequency as the system clock, since the amount of power required is prohibitive.

Therefore, it can be seen that a need exists for a system with scanning capability that can capture data for each node at any predetermined machine cycle, without requiring the scan enable signal to be run at the same high frequency of the system clock.

SUMMARY OF THE INVENTION

In contrast to the prior art, the present invention provides a system with scanning capability that can capture data for each internal node at any machine cycle, without requiring the scan enable signal to be run at the same high frequency as the system clock.

Broadly, the present invention sequentially scans a set of combinational logic and uses the system clock to gate the input to the scanning mechanism. A series of stages are provided in accordance with the number of internal nodes which input values to an internal storage element, and that are not externally connected. Each stage includes a scan latch for storing the data from the previous stages, as well as a latch to store data from the node associated with that particular stage. The cumulative data outputs from the previous stages are multiplexed with the data associated with the present stage and sequentially output, from a third latch, to subsequent stages. In this manner, the scan data is compiled for the internal nodes and output from the final stage in the sequential scanning system of the present invention. A test apparatus is connected to the scan inputs and outputs of the stages to record the scan data for subsequent analysis. The input latches in each stage are gated by the system clock and are capable of storing values for any given machine cycle. This allows the scan design to be simplified, since a separate clock generator, running at the same frequency of the system clock, is not required for the scan signal.

In accordance with the previous summary, objects, features and advantages of the present invention will become apparent to one skilled in the art from the subsequent description and the appended claims taken in conjunction with the accompanying drawings.

DETAILED DESCRIPTION OF THE PREFERRED EMBODIMENTS

Figure 1:
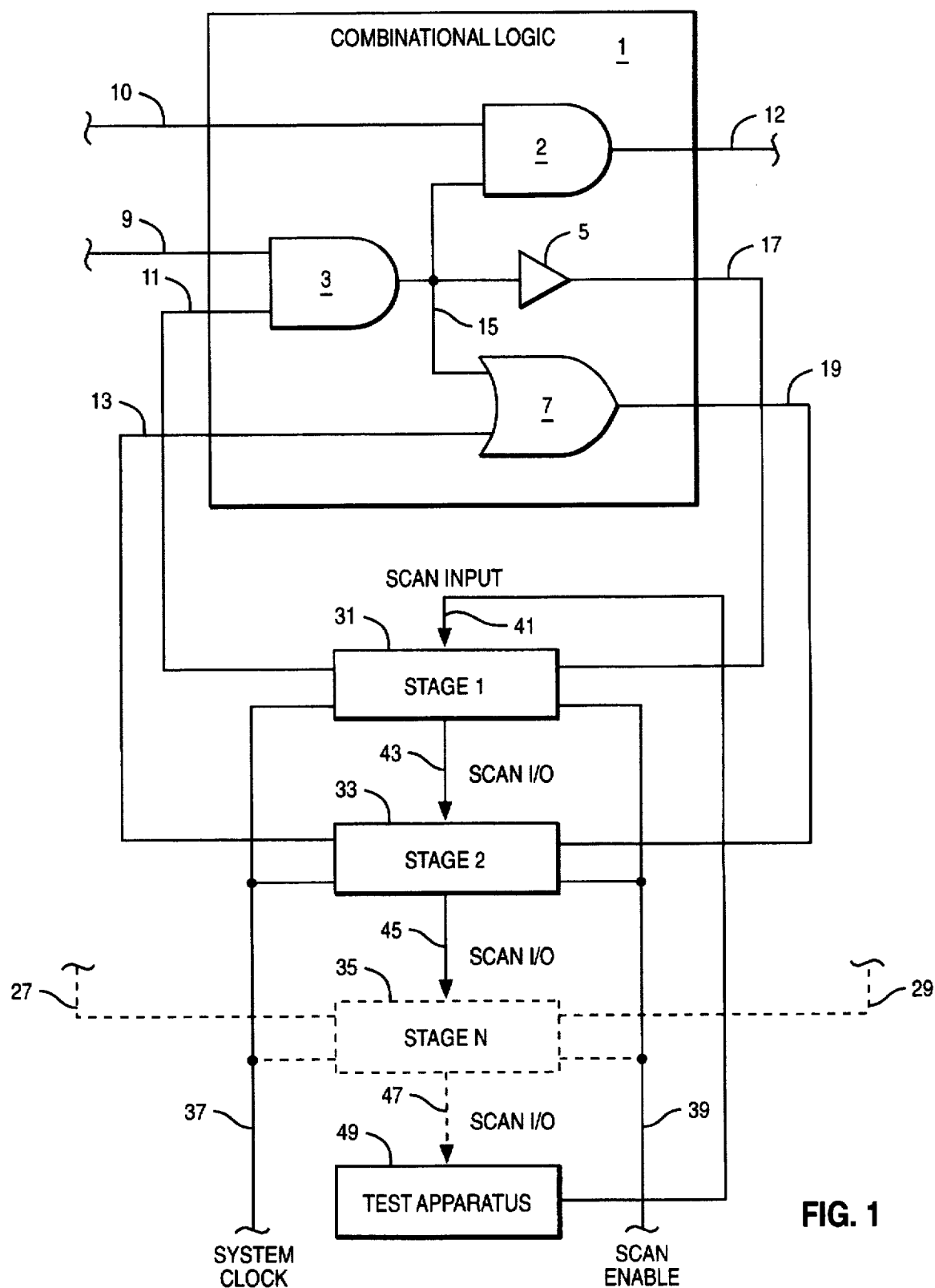
FIG. 1 is a block diagram showing the layout of a set of combinational logic connected to a sequential scanning system.

Referring to FIG. 1, a scanning design structure as contemplated by the present invention is shown. Combinational logic 1 includes AND gates 2 and 3, as well as inverter 5 and OR gate 7. The output of AND gate 3 is input to AND gate 2, inverter 5 and OR gate 7, via node 15. The AND gate 2 receives an external input on signal line 10 and outputs the resultant value on line 12, both of which are external to combinational logic 1. External node 9 is one input signal line to AND gate 3, along with internal node 11. It can be seen that various nodes, such as 11, 13, 17 and 19 are internal to the integrated circuit on which combinational logic 1 resides. That is, these nodes are not externally connected and as such cannot be tested using a conventional test apparatus which connects to each circuit node.

Therefore, a scanning design system as shown in FIG. 1 utilizes a plurality of stages 1-N which can capture data from these internal nodes at various points in time. These stages 31, 33 and 35 will be discussed in greater detail relative to FIG. 2. It should be noted that stage N (reference numeral 35) is included to illustrate the point that the total number of stages will be dependent on the number of internal nodes, in this case, nodes 17 and 19 require stages 1 and 2 (reference numerals 31, 33). Signal lines 27 and 29 are used to show a connection to additional internal nodes that may be present in other interconnected combinational logic.

Figure 5:
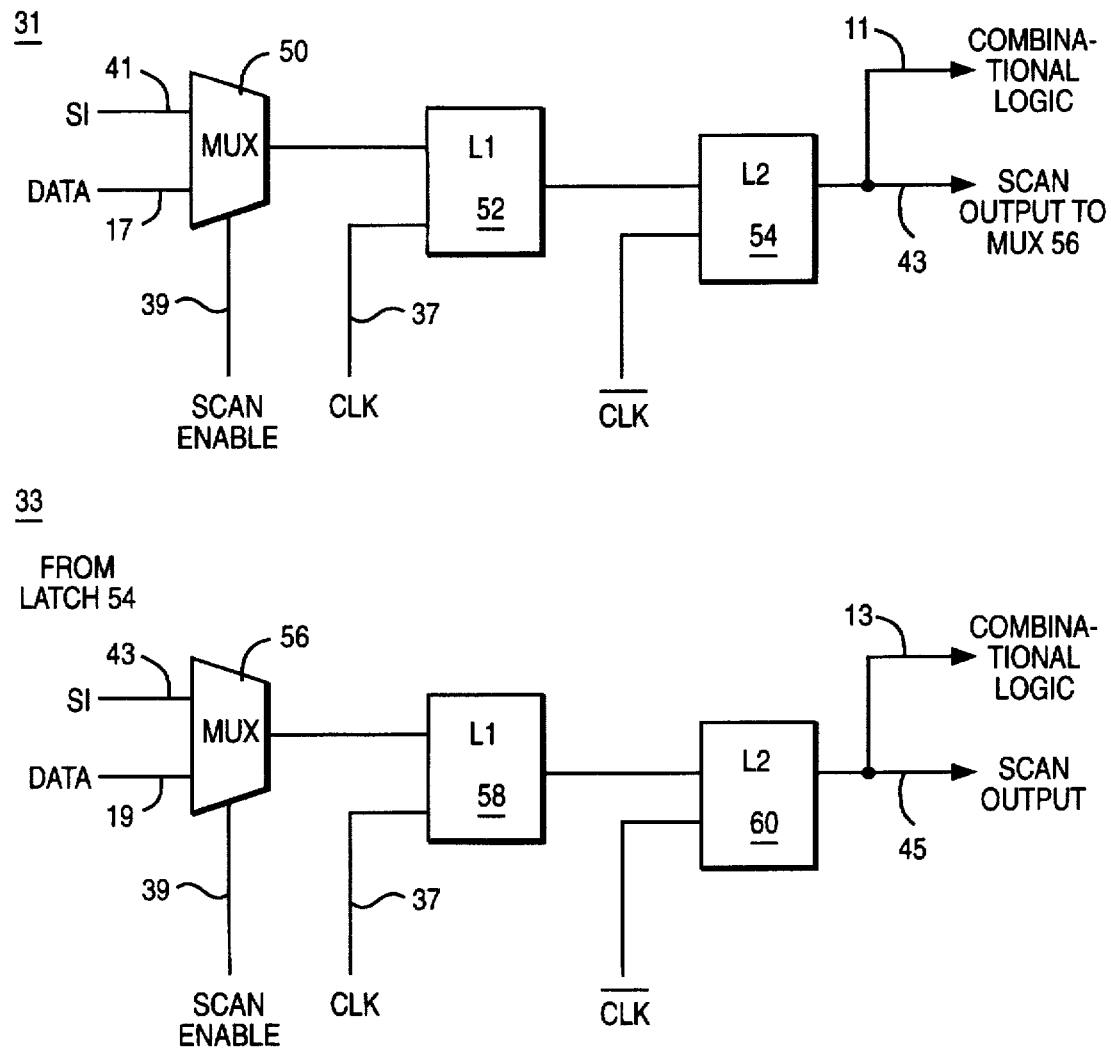
FIG. 5 is a block diagram of the scanning stages used by a sequential scanning system wherein the scan enable signal gates the input to each stage.

Test apparatus 49 is shown which connects to stages 31, 33, 35 and provides a scan input 41 to first stage 31 and receives the final output from the last stage 35 (stage N in this case) on signal line 47. Intermediate connection point 43 is used to output the scan signal from stage 31 and input that signal to stage 33. Similarly, signal line 45 outputs the scan value from stage 33 and inputs that value to the next stage 35. Typical scan systems use the system clock network signal, on line 37, as well as a scan enable clock 39 to gate the output of the various stages. As higher frequency systems are designed, e.g. systems approaching 1 gigahertz, it becomes increasingly difficult to maintain clock signals at this speed. Clearly, it is a problem to force the scan enable signal to be run at the same critical high speed as the system clock. For example, a system clock at 1 gigahertz will have a cycle time of 1 nanosecond. In contrast, typical scan enable clocks are run at 133 megahertz which translates to 8 nanoseconds per cycle. Therefore, the system clock will cause the 1 gigahertz computer system to change state eight times (eight machine cycles elapse) while the scan enable signal only causes data to be captured at every 8 cycles. Thus, it can be seen that there are numerous points throughout the cycle time of the computer system where errors can occur, but the scan enable signal is unable to capture the data at these points. Referring to FIG. 5, the components which make up one type of scanning system stage are shown and will now be described.

FIG. 5 shows two stages which are connected in series in accordance with the structure as shown in FIG. 1. In the first stage, a multiplexor 50 is shown having a data input (DATA) from an internal node, such as node 17 of FIG. 1 and a scan input (SI) from test apparatus 49 on line 41. Multiplexor 50 is also connected to scan enable signal 39. The scan enable signal gates the multiplexor which causes either the scan input or the data to be passed on to latch 52. This latch 52 is gated on the system clock and its output is connected to another latch 54 which is gated on the complement of the system clock. The output of this stage (e.g. stage 31 of FIG. 1) is then connected (via line 43) as the scan input (SI) to a multiplexor 56 in a subsequent stage (e.g. stage 33). This multiplexor 56 also receives data from an internal node, such as node 19. The output of multiplexor 56 is provided to a latch 58 gated on the system clock and its output is then provided to latch 60 gated on the system clock complement. In this manner, plural stages are sequentially connected with one stage being present for each internal node, such as nodes 17 and 19 of FIG. 1. Those skilled in the art will understand how the multiplexors 50 and 56 are in the critical path of the sequential scanning system shown in FIG. 5. Additionally in FIG. 5, it can be seen that the output of latches 54 and 60 is also provided back to combinational logic 1 of FIG. 1 on signal lines 11 and 13.

The operation of the scanning design shown in FIG. 5 will now be described. Initially, test apparatus 49 provides a scan input signal along line 41 to multiplexor 50. The scan enable clock 39 then allows the input to be provided to latch 52 based upon the system clock. This signal is then input to latch 54 based upon the complement of the system clock and subsequently provided to combinational logic 1 on line 11 of FIG. 1. The output of the combinational logic 1 is then received as data in multiplexor 50 from signal line 17. The scan enable is then disabled and the data is clocked through latches 52 and 54 and output on signal line 43, sequentially to the next stage 33.

Next, the scan input signal from line 43 is provided to multiplexor 56. The scan enable clock 39 then allows the input to be provided to latch 58 based upon the system clock. This signal is then input to latch 60 based upon the complement of the system clock and subsequently provided to combinational logic 1 on line 13 of FIG. 1. The output of the combinational logic 1 is then received as data in multiplexor 59 from signal line 19. The scan enable is then disabled and the data is clocked through latches 58 and 60 and output on signal line 45, sequentially to the next stage or back to test apparatus 49, if this is the final stage.

In this manner, inputs are provided to combinational logic 1, via the scan input signals, and the resulting data output values are provided back to the test apparatus through the various stages of the sequential scanning mechanism. Thus, the internal nodes connected to combinational logic can be tested and the resulting data output compared with the desired output which is known based upon the various logic gates included in combinational logic 1. It can be seen that the multiplexors 50 and 56 are in the critical path of the stages of this type of scanning system.

Figure 6:
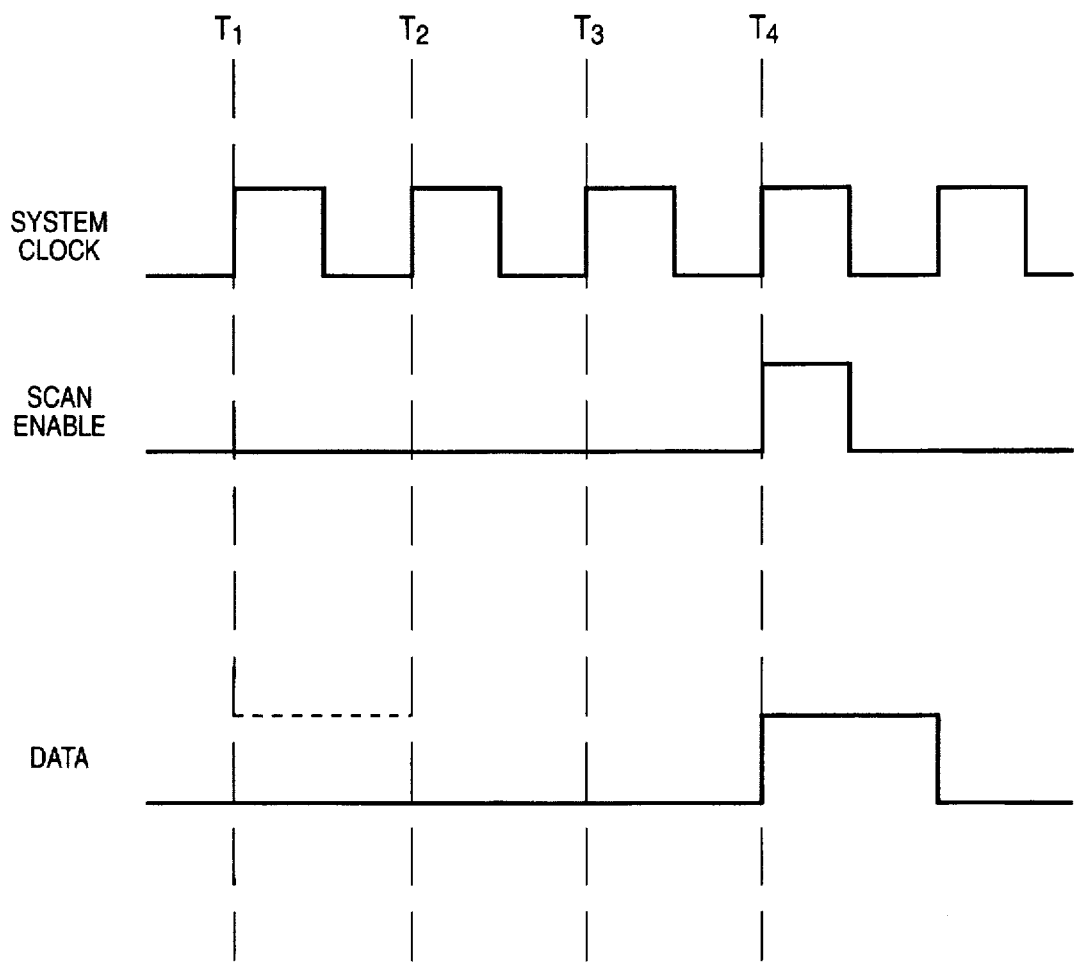
FIG. 6 is another timing diagram comparing the system clock and scan enable clock with the data values being input to the stages in the scanning system.

FIG. 6 shows that when the system clock is faster than the scan enable signal, the value input to the multiplexors as data may change prior to the scan enable signal gating the multiplexor to store the data in latch 52 and 58. FIG. 6 illustrates a situation where a timing fault has occurred even though the correct data is present. For example, the design point for a system may be for the data to be a logical 1 during time T1 to T2. However, in reality the data did not become a logical 1 until time T4 and it is at time T4 that the scan enable signal provides the data (input to the multiplexor 50) to latch 52. Thus, the test apparatus will see the correct value (logical 1) when the data is sequentially output to the tester. However, the design point called for the data to be logical 1 at time T1 and the occurrence of a logical 0 at this point, which is the actual value, is not sampled such that the tester gets incorrect information. Again, it can be seen that the multiplexor in the critical path of the output data will allow the actual data values to change in accordance with the system clock for those periods being tested.

Figure 2:
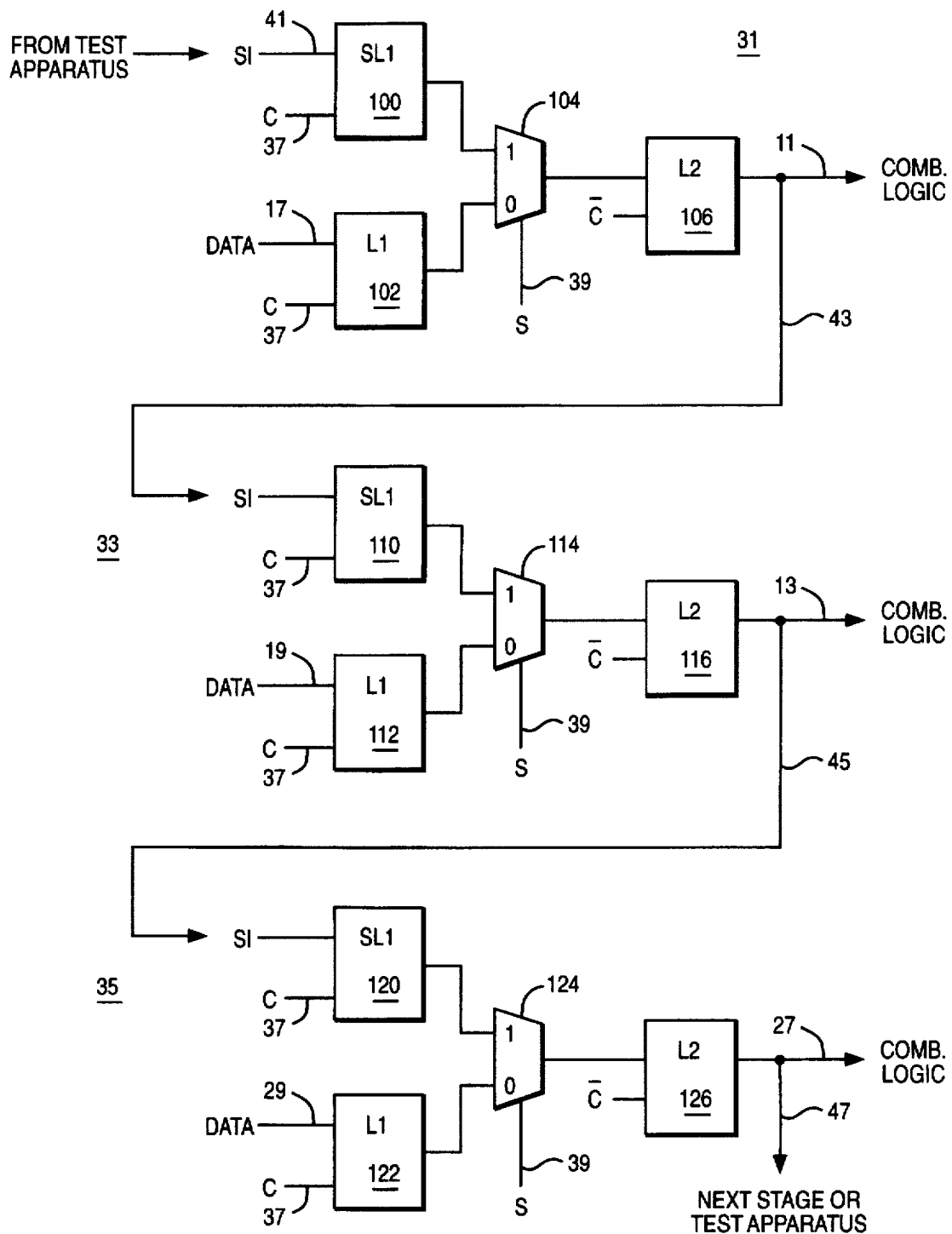
FIG. 2 is a schematic showing multiple stages of the scan design of the present invention which uses the system clock to gate each stage.

Referring to FIG. 2, a preferred embodiment of the sequential scanning system of the present invention will now be described. From FIG. 2, it can be seen that the multiplexor has been taken out of the critical path of the scan input and data flow. It can be seen that three separate stages are shown in FIG. 2 which have identical components. Thus, a single stage will now be described with the understanding that each stage operates in the same manner. For the purpose of describing the present invention, these three stages are again noted by reference numerals 31, 33, 35 and correspond to the stages shown in FIG. 1. It should be noted that the stages in FIG. 5 are also labelled with the same reference numbers to show their relationship and connections to the overall scanning system of FIG. 1. However, it can be seen that the components which are included in the stages of FIG. 5 are distinct from those now described in accordance with FIG. 2.

A scan latch 100 in stage 31 is provided for receiving the scan input signal (SI), gated off of the system clock, from test apparatus 49 on line 41. Another input latch 102, which is also based on the system clock "C", is provided for receiving data input from combination logic 1, via line 17. The output of both latches 100 and 102 are input to a multiplexor 104 which operates based upon the scan enable signal "S". The output of multiplexor 104 is provided to an output latch 106 which is gated on the complement of the system clock. Output latch 106 provides the scan input signal via line 43 to scan input latch 110 of the subsequent stage 33. Additionally, latch 106 provides data to combinational logic 1 on node 11 shown in FIG. 1. Similarly, stage 33 includes scan input latch 110 and data input latch 112 along with multiplexor 114 and output latch 116. In this case, data is provided to latch 112 from internal node 19 of FIG. 1 and the data is then output back to combinational logic 1 on node 13 of FIG. 1. The scan input signal (SI) is also provided from latch 116 to input latch 120 on line 45. The next stage 35 includes components similar to the previous stages, including scan input latch 120, data input latch 122 (which received data from node 29), multiplexor 124 and output latch 126 which provides signals to combinational logic 1, via line 27, and the next subsequent stage (or test apparatus 49 if it is the last stage) on line 47.

Taking FIG. 2 in conjunction with FIG. 1, the operation of the present invention will now be described. The test apparatus 49 will input a scan input signal (SI) into latch 100 of stage 31. During the scan input mode, these scan signals are provided to each of scan input latches 110 and 120 by enabling the multiplexors 104, 114, and 124 with the scan enable signal "S". The output latches 106, 116 and 126 then provide the scan input test signals to the various scan input latches of the subsequent stages on signal lines 43, 45, 47, respectively. Next, the scan input test signals are provided to the output latch of its respective stage, i.e. 106, 116, 126 and then further provided to the combinational logic as shown in FIG. 1. That is, stage 31 provides the scan input signal on node 11 to AND gate 3, while stage 33 provides the scan input signal on node 13 to OR gate 7. Next, the data from node 17 is provided into latch 102 of stage 31 and the data from node 19 is provided to latch 112 of stage 33. At this point, the scan enable clock is disabled and the data is provided into the output latches 106, 116, 126 of their respective stages. Further, the data is then sequentially scanned from each of the various output latches 106, 116 and 126 of the provided stages to the test apparatus 49 by enabling multiplexors 104, 114, and 124. More particularly, the data which is now stored in latch 106 of stage 31 is provided to latch 110 of stage 33. When the scan enable signal is then clocked high, this data is provided to output latch 116 and then clocked into input latch 120 of the next subsequent stage 35 and so on until all of the data is sequentially provided to test apparatus 49. The test apparatus then compares the data received from the combinational logic with the test values initially provided as scan inputs and determines, based upon the known logic elements, whether the correct values have been computed by combinational logic 1.

Figure 3A:
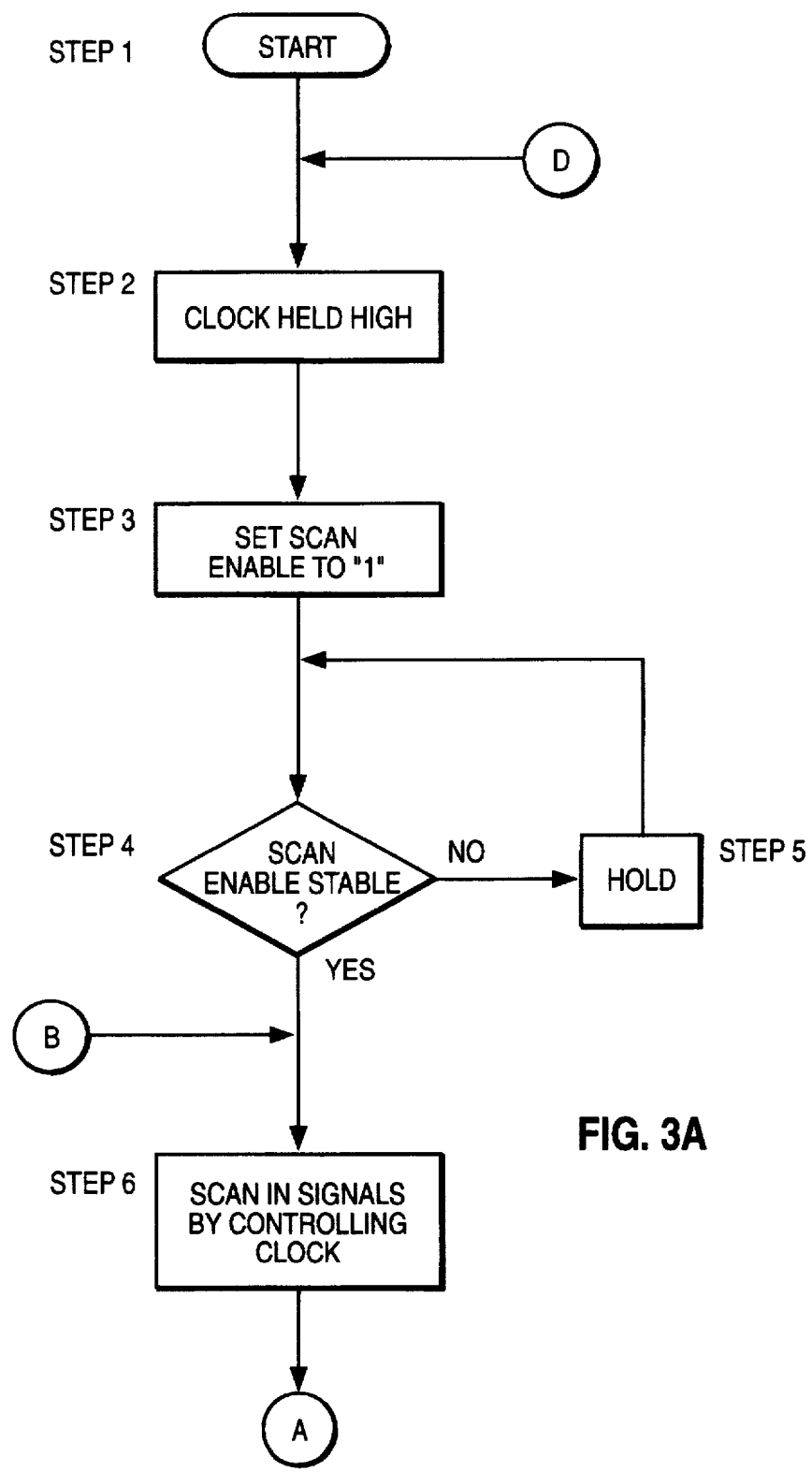
FIGS. 3A, 3B and 3C are flow charts representing the process used by the present invention to scan data from a set of combinational logic.
Figure 3B:
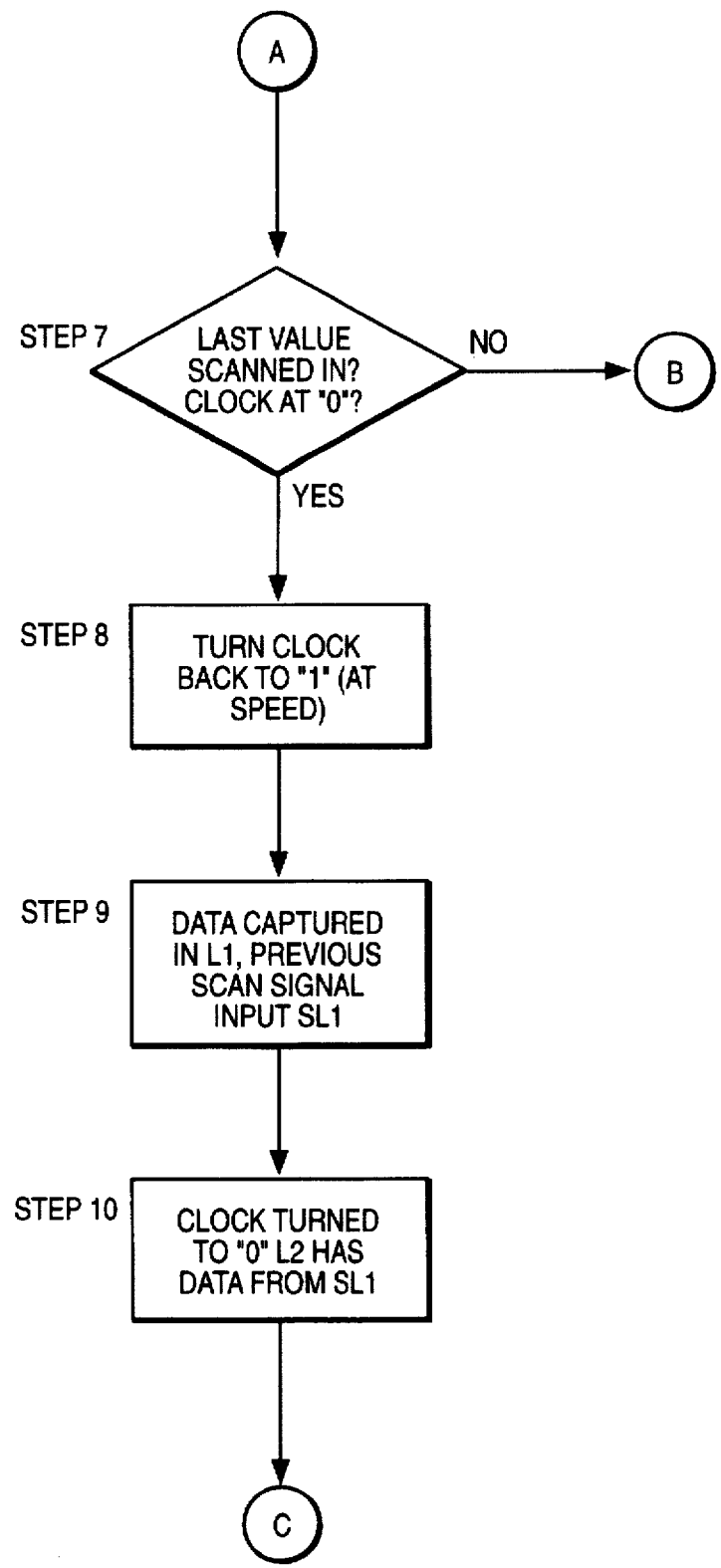

The process used by the present invention to test internal nodes in combinational logic on an integrated circuit chip will now be described with reference to the flowcharts of FIGS. 3A through 3C. Referring to FIG. 3A, the process is started at step 1 and the system clock "C" is held high at step 2. That is, the clock signal input to latches 100, 102, 110, 112, 120, 122 of FIG. 2 is held high. At step 3, the scan enable signal "S" input to multiplexors 104, 114, and 124 of FIG. 2 is set to a logical 1. It is then determined whether this scan enable signal has stabilized (step 4), i.e. have the transient electrical signals stabilized. If not, then the system clock "C" is held high until this scan signal has stabilized throughout the circuit. Once the scan enable signal stabilizes, the scan input signals (SI) are scanned into latches 100, 110 and 120, by controlling system clock "C" (step 6). It is then determined at step 7 whether the last value, SI, has been scanned into the input latches 100, 102, 112 of FIG. 2. This occurs when the system clock goes to a logical 0. If the last value has not been scanned in, then the process loops back to step 6 and continually scans in the SI signals by controlling the system clock. On the other hand, if the last value has been scanned in, the system clock is set back to a logical 1 at its normal operating speed. At step 9, the data from the combinational logic is then captured in latches, such as 102, 112 and 122 of FIG. 2. The scan signals from the previous latch are scanned into the scan input latches 100, 110 and 120. The first SI input latch 100 in the initial scanning stage, e.g. 31, receives a value from test apparatus 49 which is given a "do not care" status since there is no previous stage from which to receive actual information. Next, at step 10, the system clock is turned back to logical 0 and the output latches 106, 116 and 126 include scan data only from the scan input latches 100, 110 and 120 from the previous stages.

Figure 3C:
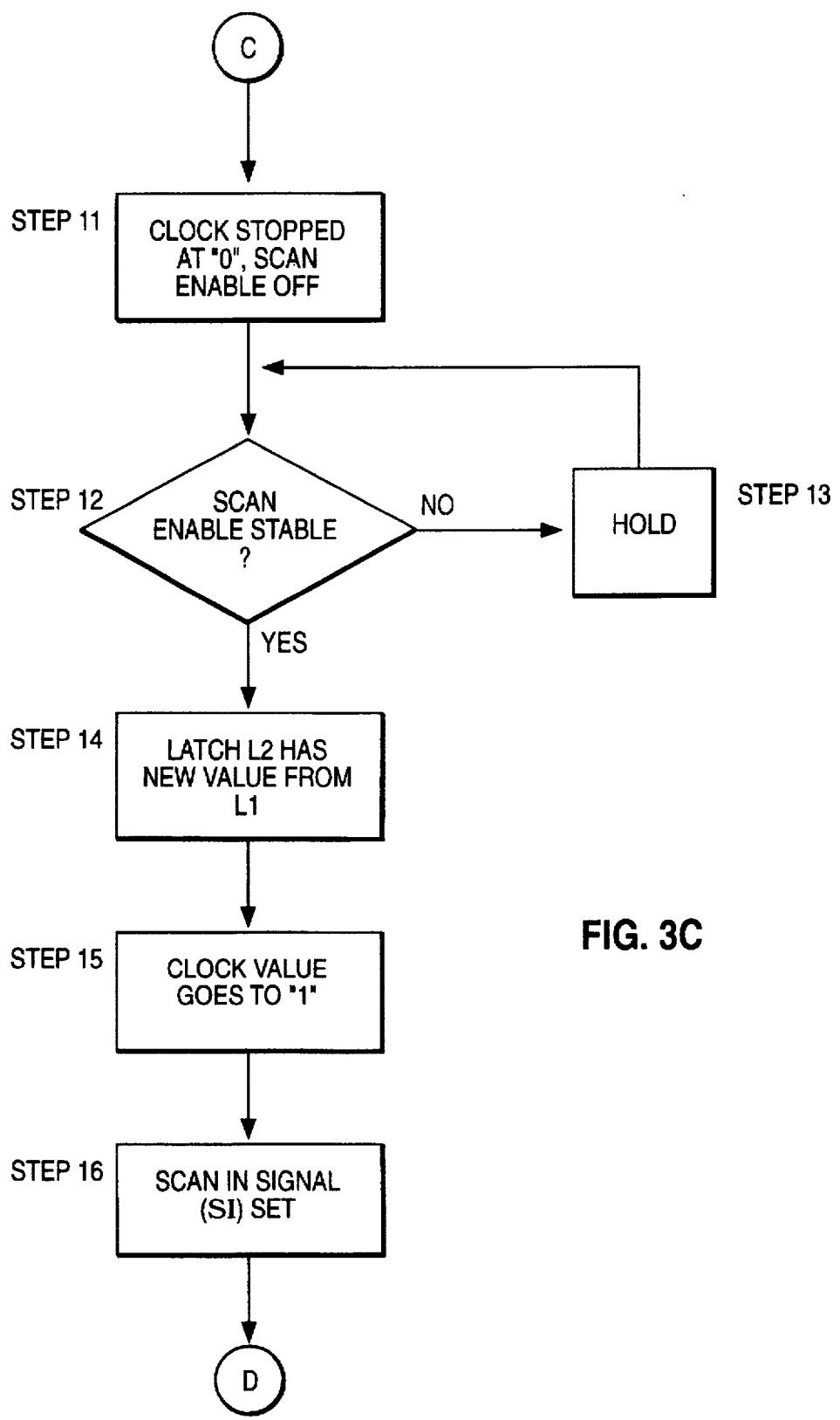

FIG. 3C continues with step 11 wherein the system clock is stopped at a logical 0 and the scan enable clock is turned off. It is then determined at step 12 whether the scan enable signal has stabilized from being turned off. If not, the system waits at step 13 until stabilization occurs. However, once the scan enable signal stabilizes, the output latch (106, 116 and 126) has a new value from the respective data input latches 102, 112 and 122 (step 14). Continuing, at step 15, the system clock value is set to a logical 1 and the scan input signal (SI) is set in accordance with the value provided from the test apparatus 49. Subsequent to step 16, the process returns to step 2 and continues for each stage included in the scanning system of the present invention.

Figure 4:
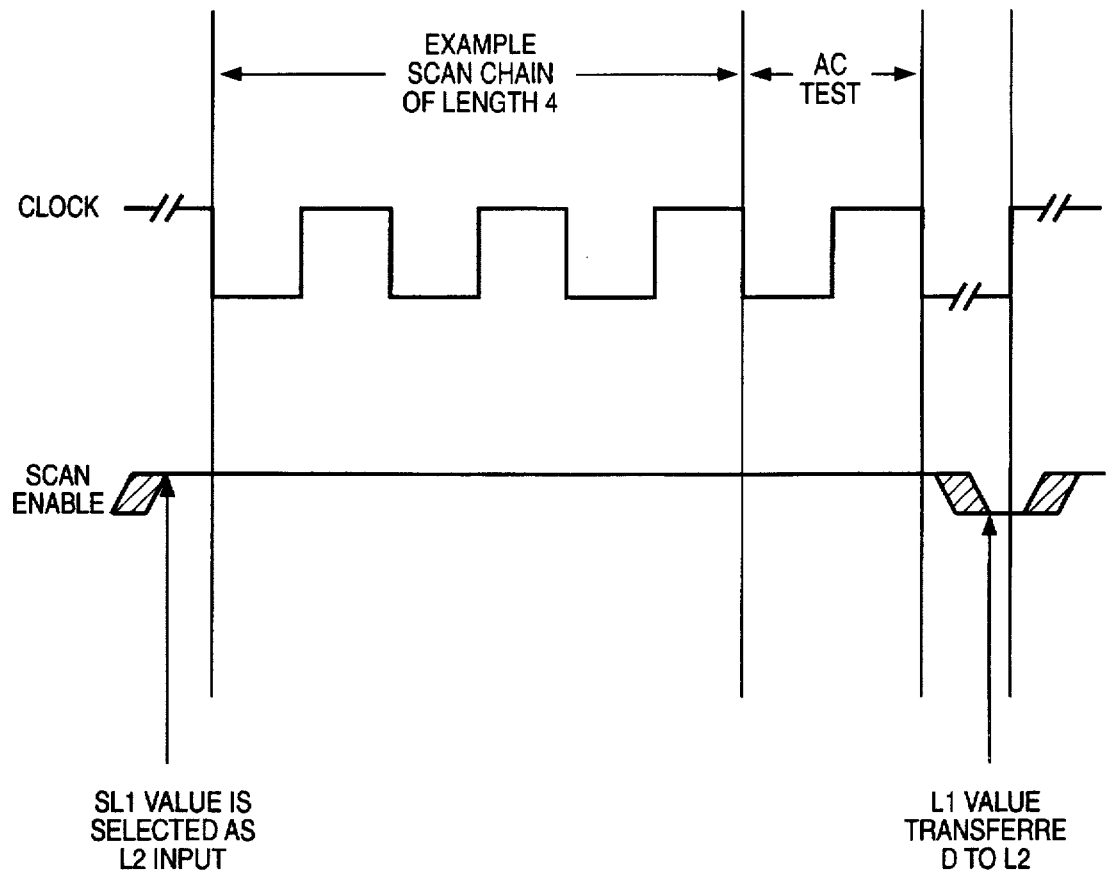
FIG. 4 is a timing diagram illustrating the sequence of events implemented by the present invention in transferring data between scan stages.

FIG. 4 is a timing diagram showing the relationship between the system clock and the scan enable signal. At time T1, the scan input value is selected as input to the latch output from the stage, 106, 116 or 126, which corresponds to enabling the scan enable signal "S". It can be seen that the scan enable signal is held high until time T3 when it is disabled and the value in data input latches 102, 112 and 122 are transferred to the output latches 106, 116 and 126, for each stage. It also can be seen that during the period T3, the actual testing occurs where the input value from the test apparatus is placed on the input node (e.g. nodes 11, 13) to the combinational logic and the data is then received by the data input latches from the internal nodes included in the combinational logic, such as nodes 17 and 19.

Although certain preferred embodiments have been shown and described, it should be understood that many changes and modification may be made therein without departing from the scope of the appended claims.

I claim:

1. A circuit for monitoring a set of logic elements, comprising:

means for receiving an input signal for testing an internal node in said set of logic elements;

means for storing node data output from said internal node, in response to said input signal, said node data representing a state of said internal node; and means for causing said node data to be provided to said means for storing responsive to a system clock.

2. A circuit according to claim 1, further comprising:

means for outputting said stored node data and said received input signal.

3. A circuit according to claim 2 wherein said means for outputting comprises means for selecting whether said stored node data or said received input signal is to be output.

4. A circuit according to claim 3 wherein said means for outputting further comprises means for providing said input signal to said set of logic elements.

5. A circuit according to claim 4 wherein said means for selecting comprises a multiplexor responsive to an enable clock.

6. A circuit according to claim 5 wherein said means for storing node data comprises a latch.

7. A method for monitoring a set of logic elements, comprising the steps of:

receiving an input signal for testing an internal node in said set of logic elements;

storing node data output from said internal node, in response to said input signal, said node data representing a state of said internal node; and causing said node data to be provided for use in said storing step responsive to a system clock.

8. A method according to claim 7, further comprising the step of:

outputting said stored node data and said received input signal.

9. A method according to claim 8 wherein said step of outputting comprises the step of selecting whether said stored node data or said received input signal is to be output.

10. A method according to claim 9 wherein said step of outputting further comprises the step of providing said input signal to said set of logic elements.

* * * * *